United States Patent [19]

Morozumi et al.

[11] 4,272,840

[45] Jun. 9, 1981

[54] SEMICONDUCTOR INTEGRATED CIRCUIT FOR A TIMEPIECE

[75] Inventors: Shinji Morozumi; Tatsushi Asakawa, both of Suwa, Japan

[73] Assignee: Kabushiki Kaisha Suwa Seikosha, Tokyo, Japan

[21] Appl. No.: 963,056

[22] Filed: Nov. 22, 1978

[30] Foreign Application Priority Data

Nov. 25, 1977 [JP] Japan ................................ 52-141153

[51] Int. Cl.[3] ...................... G04B 17/12; G04B 17/16; G04B 17/20; H03L 1/00

[52] U.S. Cl. .................................... 368/202; 368/200; 331/176

[58] Field of Search ................. 58/85.5, 23 R, 23 AC, 58/23 A; 331/176; 307/310, 304; 368/200, 202

[56] References Cited

U.S. PATENT DOCUMENTS

| | | | |
|---|---|---|---|
| 3,938,316 | 2/1976 | Morokawa et al. | 58/23 R |
| 3,939,642 | 2/1976 | Morozumi | 58/23 A |
| 3,999,370 | 12/1976 | Morokawa et al. | 58/23 R |
| 4,015,208 | 3/1977 | Hammer et al. | 328/39 |
| 4,071,813 | 1/1978 | Dobkin | 323/8 |
| 4,115,796 | 9/1978 | Fujimoto et al. | 357/42 |

*Primary Examiner*—J. V. Truhe

*Assistant Examiner*—John B. Conklin

*Attorney, Agent, or Firm*—Blum, Kaplan, Friedman, Silberman & Beran

[57] ABSTRACT

A semiconductor temperature compensation circuit for an electronic timepiece is provided. The temperature compensation circuit is characterized by a temperature detection circuit comprised of MOS transistors, at least two of which have distinct conductive coefficients for producing signals representative of variations in ambient temperature and a temperature signal converting means including MOS transistors for converting the temperature dependent signal into a temperature compensation value for effecting timing rate adjustment in an electronic timepiece. The temperature detection circuit and the temperature signal converter circuit are both formed of elements that can be monolithically integrated into the same substrate.

15 Claims, 6 Drawing Figures

SEMICONDUCTOR INTEGRATED CIRCUIT FOR A TIMEPIECE

BACKGROUND OF THE INVENTION

This invention is directed to a semiconductor temperature compensation circuit for use in an electronic timepiece and, in particular, to a semiconductor temperature compensation circuit comprised of semiconductor elements that are each integrated into the same monolithic substrate and produce a temperature compensation signal that can be utilized to effect adjustment of the timing rate of an electronic timepiece.

Electronic timepieces and, in particular, small-sized electronic wristwatches utilize a high frequency time standard to establish a very accurate timing rate. One commonly utilized time standard is flexural mode tuning fork quartz crystal vibrators having a resonant frequency on the order of 32.768 KHz. It is noted, however, that one disadvantage of quartz crystal vibrators is that the temperature characteristics thereof vary in response to temperature changes and aging.

Heretofore, these changes in frequency as a result of temperature, aging and the like have been compensated for in different ways. For example, one approach is to utilize a capacitor having a temperature compensation characteristic in the oscillator circuit utilized in combination with the quartz crystal vibrator. Another approach is to utilize two quartz crystal vibrators vibrating at distinct frequencies in order to compensate for changes in temperature. These approaches have not yielded sufficiently high accuracy due to the stability of the vibrator, the considerable expense in achieving such temperature compensation and in the large number of components required to achieve such temperature compensation. Accordingly, a temperature compensation circuit for use in an electronic wristwatch that avoids the above noted disadvantages is desired.

SUMMARY OF THE INVENTION

Generally speaking, in accordance with the instant invention, a semiconductor temperature compensation circuit for use in an electronic timepiece is provided. The temperature compensation circuit includes a temperature detection circuit having a first subcircuit comprised of a plurality of MOS transistors and a second subcircuit identical to said first subcircuit, each of said subcircuits having the threshold voltage of the same like polarity transistor shifted with respect to each other. One of the respective like polarity transistors in each circuit have a shifted threshold voltage further having a distinct conductance coefficient with respect to each other, in order to produce a temperature detection signal representative of changes in temperature. A temperature signal converter circuit also includes MOS transistors and, in response to the temperature detection signal applied thereto, is adapted to produce a temperature compensation signal that is to be processed in a processing unit comprised of MOS transistors and adjusted therein by a predetermined coefficient and applied to an electronic timepiece to vary the timing rate thereof. The temperature signal converter circuit is formed of MOS elements that are integrated onto the same monolithic substrate as each of the MOS transistors in the first and second subcircuits of said temperature detector circuit and the processing unit.

Accordingly, it is an object of the instant invention to provide an improved semiconductor temperature compensation circuit for use in an electronic timepiece.

A further object of the instant invention is to provide a semiconductor temperature compensation circuit that is comprised of semiconductor elements including MOS transistors that can be monolithically integrated into the same substrate as the semiconductor circuit elements comprising the timepiece circuitry.

Still other objects and advantages of the invention will in part be obvious and will in part be apparent from the specification.

The invention accordingly comprises the features of construction, combination of elements, and arrangement of parts which will be exemplified in the construction hereinafter set forth, and the scope of the invention will be indicated in the claims.

BRIEF DESCRIPTION OF THE DRAWINGS

For a fuller understanding of the invention, reference is had to the following description taken in connection with the accompanying drawings, in which.

DETAILED DESCRIPTION OF THE PREFERRED EMBODIMENTS

Figure 1:
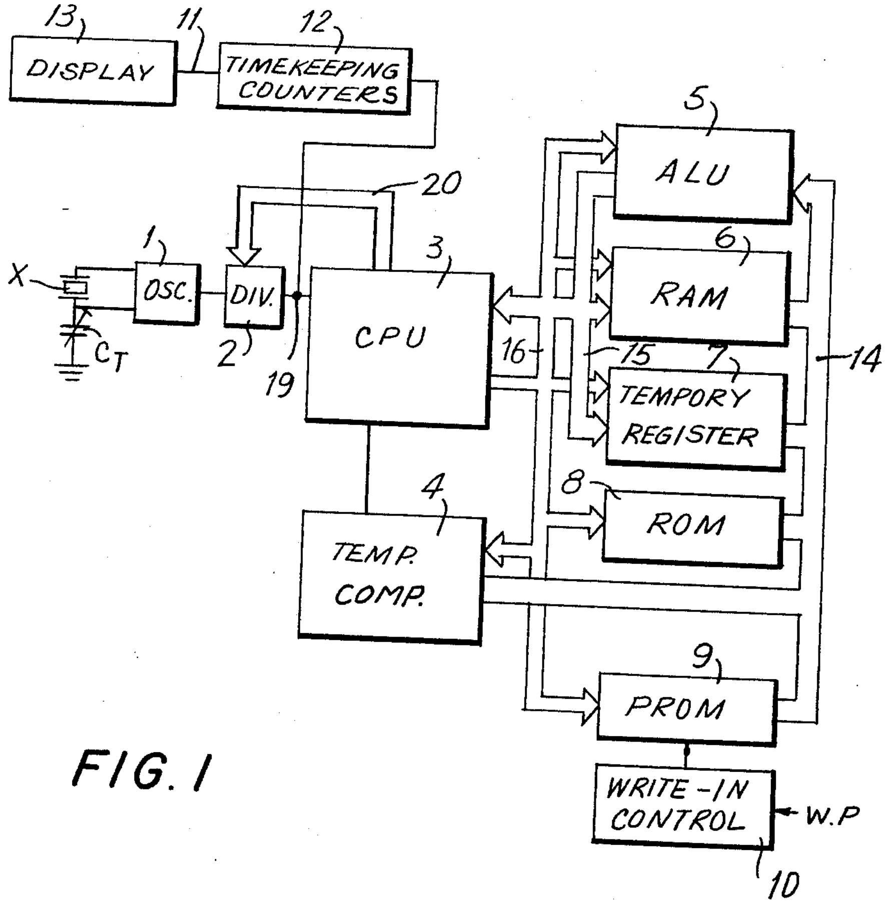
FIG. 1 is a block circuit diagram of an electronic timepiece circuit including a semiconductor temperature compensation circuit constructed in accordance with the instant invention.

Reference is first made to FIG. 1, wherein a block circuit diagram of an electronic timepiece, having incorporated therein a semiconductor temperature compensation circuit constructed in accordance with the instant invention, is depicted. The electronic timepiece includes a quartz crystal vibrator X coupled to a C-MOS oscillator circuit 1 in order to produce a high frequency time standard signal on the order of $2^{16}$ Hz. A variable tuning capacitor $C_T$ is coupled to the quartz crystal vibrator X in oscillator circuit 1 in order to effect a fine tuning of the high frequency time standard signal produced by the oscillator circuit 1. A divider circuit 2 comprised of a plurality of series-connected binary divider stages is coupled to the oscillator circuit in order to receive the high frequency time standard signal produced thereby and produce a low frequency timing signal. The low frequency timing signal is applied to a plurality of series-connected timekeeping counters, which counters are adapted to produce low frequency timekeeping signals 11 representative of hours, minutes, seconds and the like. The low frequency timekeeping signals 11 are, thereafter, applied to a conventional digital display 13 comprised of decoders, drivers and seven-segment digital display digits that effect the display of the timekeeping information in response to the timekeeping signals applied thereto.

Additionally, the low frequency timing signals produced by the divider 2 are applied to a processing unit incorporated into the electronic timepiece, which unit is adapted to effect timing rate adjustment of either the division ratio of the divider circuit or, alternatively, the frequency of the high frequency time standard signal produced by the oscillator circuit in response to a temperature compensation signal produced by temperature compensation circuit 4. The processing unit is conventional and includes a central processing unit 3 (CPU) having control logic that includes a programmable logic array for generating address data and control data to effect programming of the processing unit, an arithmetic logic unit 5 (ALU), a random access memory 6 (RAM), a temporary register 7 for effecting operations, a read only memory 8 (ROM) for providing a constant, and a programmable read only memory 9 (PROM), which programmable unit effects transfer of information along buses 14 and 15 in a conventional manner. Coupled to the buses 14 and 15 is the semiconductor temperature compensation circuit for transferring to the programmable unit a temperature compensation signal so that same may be processed by the processing unit a manner to be discussed in greater detail below. The manner in which the respective elements of the processing unit effect information transfer, storage, processing and retrieval are well known in the art, are without the scope of the invention defined herein, and, hence, a detailed description thereof is not necessary for an essential understanding of the instant invention.

Figure 2:
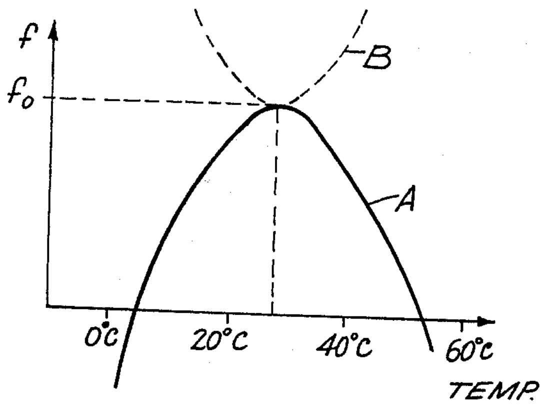
FIG. 2 is a graphical illustration of the temperature-frequency characteristic and temperature compensation characteristic of a flexural mode quartz crystal vibrator.

As illustrated in FIG. 2, the temperature-frequency characteristic of a flexural mode quartz crystal vibrator is illustrated by the curve A. Curve B, defined by dashed lines, illustrates the compensation or correction curve for a quartz crystal vibrator having this characteristic and, accordingly, the instant invention is particularly characterized by the semiconductor temperature compensation circuit, depicted in FIG. 3, for generating a temperature compensation signal that can be readily adjusted by the processing unit to correspond to the curve B, illustrated in FIG. 2.

Figure 3:
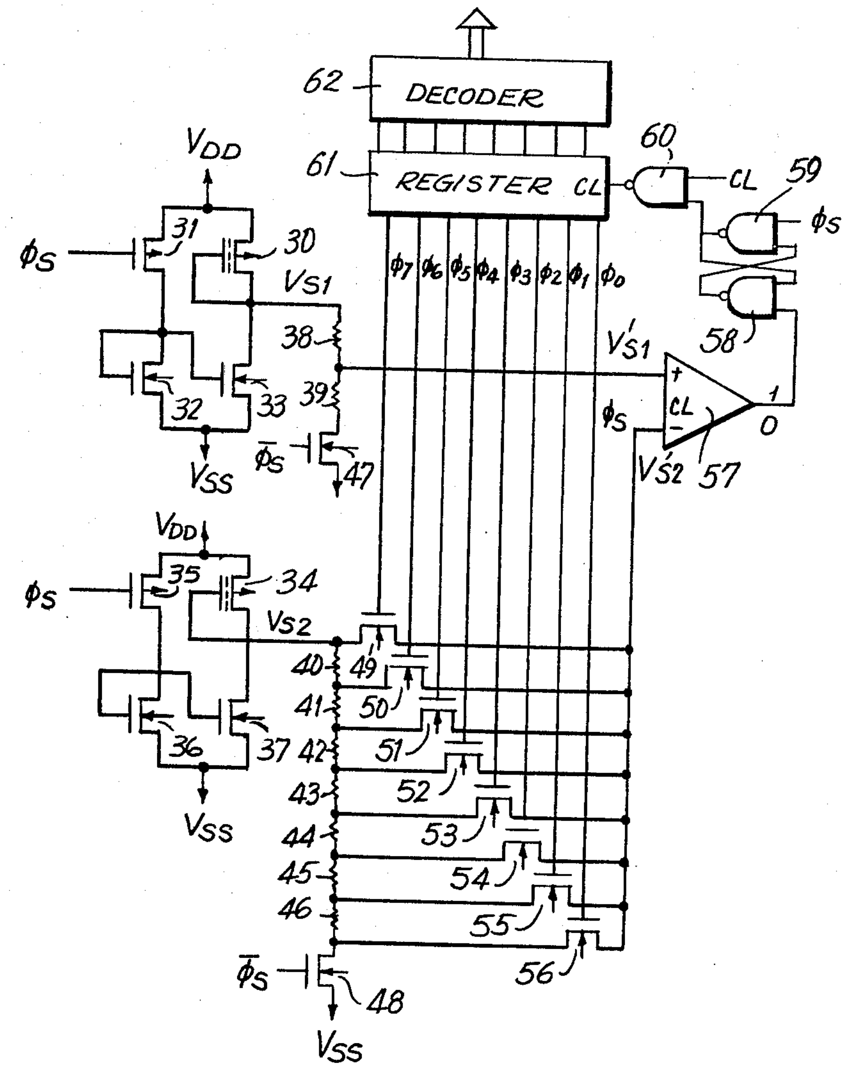
FIG. 3 is a circuit diagram of a semiconductor temperature compensation circuit constructed in accordance with the preferred embodiment of the instant invention.

Reference is now made to FIG. 3, wherein the temperature compensation circuit 4 for use in the timepiece illustrated in FIG. 1, is depicted in detail. A temperature detection circuit is defined by two MOS transistor subcircuits: The first subcircuit including MOS transistors 30 through 33 and the second subcircuit including MOS transistors 34 through 37. Specifically, a P-channel transistor 31, in the first subcircuit, and P-channel transistor 35, in the second subcircuit, are adapted to have a sample pulse $\phi_S$ applied to the gate electrode thereof. Moreover, both P-channel transistors 31 and 35 of the first and second subcircuits are respectively formed in a C-MOS pair with N-channel transistors 32 and 36, with the respective drain electrodes of both P-channel transistors being commonly coupled with the drain terminal and, additionally, the gate terminal of the N-channel transistors in the C-MOS pair. A second C-MOS pair, in each subcircuit, is respectively defined by P-channel transistors 30 and 34 and N-channel transistors 33 and 37 with the N-channel transistors having their gate electrode coupled to the common drain of the other C-MOS pair of transistors in the subcircuit. P-channel transistors 30 and 34 are illustrated in FIG. 3 of the drawings as having their threshold voltage shifted by ion implantation channel doping and this shift in threshold voltage is illustrated by a dashed line between the gate electrode and the connection of the source and drain electrodes.

The respective outputs $V_{S1}$ and $V_{S2}$ respectively produced by the first and second subcircuits are representative of the differences in the threshold voltage shifts of the P-channel transistors 30 and 34, since the remaining elements in the respective subcircuits are coupled together in the same manner and, hence, have the same characteristics. It is noted, however, that if the conductance coefficient $\beta$ of the P-channel transistors 30 and 31 are identical to the conductance coefficients of P-channel transistors 34 and 35, the respective output voltage $V_{S1}$ and $V_{S2}$ of both subcircuits will not vary as a result of variations in the supply voltage or temperature.

In order to avoid this result, and obtain a temperature compensation characteristic, the instant invention is directed to providing the pair of P-channel transistors 30 and 31 of the first subcircuit with a conductance coefficient that is distinct from the conductance coefficient of the P-channel transistors 34 and 35 of the second subcircuit. Specifically, in the exemplary semiconductor temperature compensation circuit, depicted in FIG. 3, the output $V_{S1}$ of the first subcircuit varies in response to changes in temperature although not considerably, whereas the output voltage $V_{S2}$ of the second subcircuit has substantially no variation (temperature coefficient of 0). Thus, by providing the like polarity and like positioned MOS transistors 30 and 34 in the first and second subcircuit with distinct conductance coefficients, the threshold values of the MOS transistors and the respective conductance coefficients thereof obtain a temperature dependent characteristic based on the mobilities of the respective transistors in the first and second subcircuits.

The output voltage $V_{S1}$ is applied to a temperature signal converter circuit that includes resistors 38 and 39 forming a voltage divider circuit for applying a divided voltage signal $V'_{S1}$ to the positive input of a comparator 57. The output $V_{S2}$ of the second subcircuit is applied through a voltage divider network comprised of series-connected resistors 40 through 46 and MOS switching transistors 49 through 56 to the negative input of comparator 57 as a voltage signal $V'_{S2}$.

It is noted that the operation of the temperature detection circuit and the temperature converting circuit is controlled by the application of the sample pulses $\phi_S$ thereto. The sample pulse $\phi_S$ is applied once every ten seconds or once each minute and has a pulse width (sampling time) on the order of 1 to 10 m-sec. By applying $\phi_S$ to the P-channel transistors or the complement thereof $\phi_S$ to the N-channel transistors, the LOW binary level sample pulses $\phi_S$ effect a coincident operation of each of the circuits for a small interval of time sufficient to produce a temperature compensation signal in a manner to be discussed in greater detail below.

Specifically, by applying the sample pulse $\phi_S$ to the temperature detecting circuit and to the temperature converting circuit, the comparator 57 continues to compare the voltage divided output $V_{S1}$ and $V_{S2}$ produced by the temperature detecting subcircuits and causes a gating signal to be applied through a set-reset circuit defined by NAND gates 58 and 59 to a NAND control gate 60. When the value of $V'_{S1}$ and $V'_{S2}$ are the same, the set-reset flip-flop is reset, thereby applying a LOW level input to control NAND gate 60 to thereby prevent the clock signal CL from being applied therethrough to register 61. The binary value read into the register is then applied to the decoder which squares the data and decodes it without having to perform any further logic operation, the decoded value produced thereby being directly usable as a division ratio adjustment signal of the type illustrated as 20 in FIG. 1.

It is noted that the register 61 operates in combination with MOS transistors 49 through 56 in order to provide an analog-to-digital type conversion. Specifically, the analog-to-digital converson is effected in the following manner. First, MOS transistor 56 is turned ON by the signal $\phi_0$ produced by register 61 and each of the MOS transistors, 49 through 55, are turned OFF by the signal $\phi_1$ through $\phi_7$ produced by register 61. Accordingly, at the time that sample signals $\phi_S$ and $\phi_S$ are applied to the temperature detecting circuit and the temperature signal converting circuit, the signal $V'_{S1}$ is applied to comparator 57 and is compared therein with the signal $V'_{S2}$, which signal equals the output $V_{S2}$ of the second temperature detecting subcircuit divided by resistors 40 through 46. In response to detecting a difference in the voltage levels of $V'_{S1}$ and $V'_{S2}$, applied to the comparator 57, a HIGH level signal is applied to the set-reset flip-flop thereby permitting a clock pulse to be applied through NAND gate 60 to thereby index register 61 to apply a signal $\phi_1$ to gating MOS transistor 55 and prevent outputs $\phi_0$ and $\phi_2$ through $\phi_7$ of register 61 from turning on gating transistors 49 through 54 and 56 of the analog-to-digital divider network. By turning ON switching transistor 55 and turning OFF switching transistor 56, the output voltage $V_{S2}$ is now divided between resistor 46 and resistors 44 through 45, thereby changing the value of $V'_{S2}$ that is compared with $V'_{S1}$ by the comparator during the next interval that sampling pulse is applied thereto. As aforenoted, this operation continues until the voltage level of both inputs to the comparator 57 are equal, whereupon the set-reset flip-flop prevents any more clock pulses from being applied to the register 61, hence establishing a temperature compensation value. It is this value which is then applied to the decoder circuit and decoded into a binary coded temperature compensation signal that can be applied to the processing unit for adjusting by a predetermined coefficient stored therein to effect adjustment of the timing rate thereof of the timekeeping circuitry.

It is noted that the analog-to-digital conversion effected by the temperature signal converting circuit, illustrated in FIG. 3, is limited to a distinct detection level. However, it is apparent that the number of detection levels can be increased by increasing the number of switching transistors and series-connected dividers as is deemed necessary. Thus, in light of the operation, discussed above, it is apparent that the instant invention is characterized by the use of the temperature coefficient and mobility characteristic not only in the surface of the MOS transistors but also throughout the bulk thereof.

In the case where the variation in the temperature characteristic of the quartz crystal vibrator is not significant, or where the timing rate is not negatively effected thereby, the temperature coefficient of the quartz crystal vibrator can be written into the ROM 8 as a binary signal utilizing a conventional mask. If a more exacting adjustment is also required, an optimum write-in value WP can be written through the writing control circuit 10 to the PROM 9 in order to cancel out the variations in the temperature coefficient of the quartz crystal vibrator. It is further noted that if FAMOS elements (floating gate avalanche injection MOS) are used to synthesize the PROM, an operating voltage on the order of 20 to 50 V is required. Accordingly, any non-volatile memory elements, such as fusible type memories, diodes, insulation breakdown type memory elements wherein the insulation breakdown occurs on an insulating film, etc., can also be utilized to synthesize the PROM. Other non-volatile devices that can be utilized include mechanical switches, wire bonding and/or laser trimming.

Figure 4:
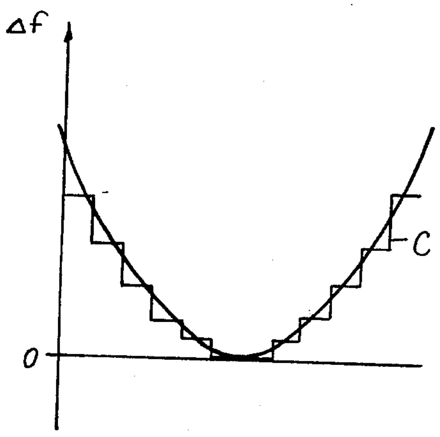
FIG. 4 is a graphical illustration of the temperature compensation signal produced by the semiconductor compensation circuit depicted in FIG. 3.
Figure 5:
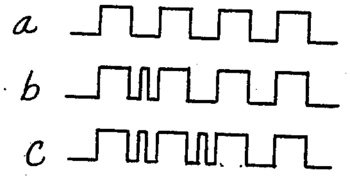
FIG. 5 is a wave diagram illustrating the manner in which the timing rate adjustment of an electronic timepiece is affected by the semiconductor temperature compensation circuit depicted in FIG. 3.

Accordingly, if the temperature coefficient of the quartz crystal vibrator is known, and a temperature compensation signal is obtained, the CPU 3, ALU 5, RAM 6 and temporary register 7 can determine a correction value in accordance with a simple formula. For example, assuming the temperature compensation signal to be linear, it can be multiplied by itself and then multiplied once again by an appropriate coefficient in order to obtain the curve C, illustrated in FIG. 4. Thereafter, a correction signal 20, corresponding to the curve C. would be applied to the divider 2 as a division ratio adjustment signal. As is illustrated in FIG. 5, by applying a frequency adjustment signal to the divider circuit 2, a single pulse, as illustrated by wave train b in FIG. 5, or the two pulses, as illustrated by wave c in FIG. 5, is added to the timing rate of the divider circuit to effect an increase in the timing rate of the timekeeping circuitry of the timepiece. Moreover, since the logic compensation of the absolute timing rate (the compensation of the timing rate is performed by adjusting the division rate of the divider circuit and not by adjusting the tuning capacitor $C_T$ in the oscillator circuit) is performed by the same circuitry utilized to effect temperature compensation adjustment of the timing rate, the number of circuit elements required to effect temperature compensation is reduced. It is also noted that temperature compensation can be performed by applying an adjustment signal to the oscillator circuit to vary the tuning capacitance thereof. Accordingly, in an electronic timepiece, of the type illustrated in FIG. 1, all the functions of the timekeeping circuitry, including the oscillator, divider, etc., are controlled by the ALU and CPU so that only the temperature detecting circuit must be separately provided, the remaining components, such as the RAM, ROM, CPU being used in common with the remaining control circuitry. Thus, a timepiece having the temperature compensation circuit of the instant invention is less expensive to manufacture and can be further miniaturized as a result of the simplicity thereof.

Figure 6:
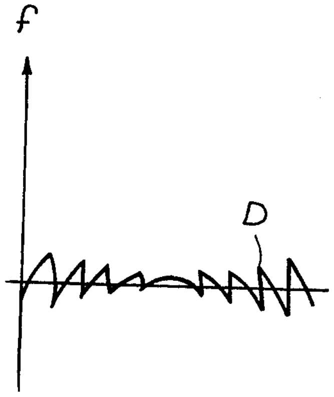
FIG. 6 is a graphical illustration of the compensation flexural mode frequency-temperature characteristic of a quartz crystal vibrator in an electronic wristwatch including the semiconductor temperature compensation circuit of the instant invention.

Referring to FIG. 6, the curve D therein illustrates the actual temperature-frequency characteristics of the timing rate of an electronic timekeeping circuit that is compensated by the temperature compensation circuit depicted in FIG. 3. Although the temperature-frequency characteristic is rippled, the accuracy thereof is greatly increased when compared with the curve A, illustrated in FIG. 2, as changes in temperature occur. Since the inside of the timepiece is maintained at a constant temperature and the temperature difference is negligible and, hence, can be ignored, no problems occur in the quartz crystal vibrator and IC.

Accordingly, the instant invention is characterized by the use of the same semiconductor elements that are monolothically integrated into a substrate in conventional electronic timepieces to synthesize the temperature compensation circuit and function as temperature detection elements in accordance with the teachings of the instant invention. This results in miniaturization, reduced costs of manufacture and a highly accurate digital display electronic timepiece. Moreover, utilizing the temperature compensation circuit of the instant invention, a digital display can be utilized to display temperature.

It is noted that if the timepiece is provided with a CPU, the temperature compensation is performed by utilizing the CPU in order to effectively compensate the variations in frequency caused by variations in the timing rate of the quartz crystal vibrator or the timekeeping circuitry that produces the low frequency timekeeping signals. It is noted, however, that the temperature compensation can be effected by utilizing the circuit depicted in FIG. 3 without the necessity of many of the programming circuits in the processing unit, thereby further facilitating the design of an electronic timepiece incorporating the semiconductor temperature compensation circuit of the instant invention.

It will thus be seen that the objects set forth above, among those made apparent from the preceding description, are efficiently attained and, since certain changes may be made in the above construction without departing from the spirit and scope of the invention, it is intended that all matter contained in the above description or shown in the accompanying drawings shall be interpreted as illustrative and not in a limiting sense.

It is also to be understood that the following claims are intended to cover all of the generic and specific features of the invention herein described and all statements of the scope of the invention which, as a matter of language, might be said to fall therebetween.

What is claimed is:

1. A semiconductor temperature compensation circuit for use in an electronic timepiece, comprising in combination, temperature detecting means including a first subcircuit having at least two MOS transistors and a second like configured subcircuit having at least two MOS transistors at least one like polarity MOS transistor in each subcircuit having a different threshold value with respect to the remaining MOS transistors in each subcircuit so that said first and second subcircuits each produce temperature signals having a voltage level determined by the different threshold values of said one like polarity MOS transistor, and at least one like positioned transistor in each subcircuit having a different conductive coefficient with respect to each other so that said first and second subcircuits each produce temperature signals that are distinctly varied in response to changes in temperature and a plurality of semiconductor elements including MOS transistors defining a temperature signal converting circuit for receiving said temperature signals produced by said temperature detecting means and, in response thereto, converting same into a temperature compensation signal, each of the semiconductor elements in said temperature signal converting circuit and the MOS elements defining said temperature detecting means being monolithically integrated into the same substrate.

2. A semiconductor temperature compensation circuit as claimed in claim 1, and including processing circuit means for receiving said temperature compensation signal and processing same utilizing at least a predetermined coefficient in order to obtain a timing rate adjustment signal.

3. A semiconductor temperature compensation circuit as claimed in claim 2, wherein said processing circuit means includes at least a memory for storing said predetermined coefficient, said predetermined coefficient being adapted in response to being applied to said temperature compensation signal to produce said timing rate adjustment signal.

4. A semiconductor temperature compensation circuit as claimed in claim 3, wherein each of said elements comprising said temperature detection means, said temperature signal converting circuit and said processing circuit means are semiconductor elements that are adapted to be monolithically integrated into the same substrate.

5. A semiconductor temperature compensation circuit as claimed in claim 3, wherein said processing circuit means includes write-in processing means coupled to said memory, said write-in processing means being adapted to vary the predetermined coefficient stored in said memory by writing therein a different predetermined coefficient.

6. A semiconductor temperature compensation circuit as claimed in claim 2, wherein said first subcircuit and said second subcircuit each include two C-MOS pairs of transistors, each pair of like channel transistors in each subcircuit having distinct threshold values.

7. A semiconductor temperature compensation circuit as claimed in claim 6, wherein said distinct threshold values of said like polarity transistors in each subcircuit are obtained by ion implantation channel doping one of said pair of like polarity transistors to a level that is distinct from the channel doping level of the remaining MOS transistors in said subcircuit.

8. A semiconductor temperature compensation circuit as claimed in claim 6, wherein said temperature signal converting circuit includes an analog-to-digital selectively variable resistive network coupled to said first subcircuit and a comparator means coupled to said second subcircuit, said comparator means being coupled to said resistive network and to said second subcircuit, said comparator means being adapted to periodically detect when said output of said first subcircuit has been selectively varied to the same level as the output of said second subcircuit and thereby produce said temperature compensation signal.

9. An electronic timepiece comprising in combination timekeeping circuit means including a high frequency time standard having a predetermined temperature characteristic, said timekeeping circuit means being adapted to produce low frequency timing signals having a timing rate that is based on the frequency of said high frequency time standard, timing rate adjustment means coupled to said timekeeping circuit means for applying thereto a timing rate adjustment signal for varying the timing rate of the low frequency timing signal produced thereby, a semiconductor temperature compensation circuit including MOS transistor detection means for producing a temperature signal in response to changes in ambient temperature and a semiconductor temperature signal converting circuit for producing a temperature compensation signal in response to said temperature signal, and processing circuit means coupled to said temperature signal converting circuit for receiving said temperature compensation signal produced thereby and in response thereto for adjusting said signal by a predetermined adjustment coefficient to thereby produce a temperature adjustment timing rate control signal corresponding to the predetermined temperature characteristic of said high frequency time standard, said temperature adjustment timing rate control signal being applied to said timing rate adjustment means to selectively vary the timing rate adjustment signal applied by said timing rate adjustment means to said timekeeping circuit means, said temperature detection means includes a first MOS transistor circuit and a second like configured MOS transistor circuit, at least two like polarity MOS transistors in each circuit having a distinct threshold value, and at least one like positioned transistor in each circuit having a distinct conductance coefficient with respect to each other, and a plurality of semiconductor elements for defining a temperature signal converting circuit for receiving the temperature signal produced by the temperature detecting means and in response thereto converting same into said temperature compensation signal.

10. An electronic timepiece as claimed in claim 9, wherein said timekeeping circuit means includes an oscillator circuit coupled to said high frequency time standard for producing a high frequency time standard signal and divider means comprised of a plurality of series-connected divider stages for receiving said high frequency time standard signal and dividing same down into said low frequency timing signal having a timing rate that is based on the frequency of said high frequency time standard signal.

11. An electronic timepiece as claimed in claim 10, wherein said timing rate adjustment means is coupled to said divider means in order to selectively vary the division ratio thereof and thereby adjust the timing rate of the low frequency timing signals produced thereby.

12. An electronic timepiece as claimed in claim 10, wherein said oscillator circuit means includes tuning capacitance means, said timing rate adjustment means being coupled to said tuning capacitance means for selectively varying the capacitance thereof in order to effect compensation of the timing rate of the low frequency timing signal in response to changes in temperature.

13. An electronic timepiece as claimed in claim 9, wherein each of said semiconductor elements in said temperature signal converting circuit, said temperature detecting circuit and said processing circuit being monolithically integrated into the same substrate.

14. An electronic timepiece as claimed in claim 13, wherein said processing circuit means includes at least a memory for storing said predetermined coefficient, said predetermined coefficient being adapted in response to being applied to said temperature compensation signal to produce a temperature adjustment timing rate control signal for compensating for the predetermined temperature characteristic of said high frequency time standard.

15. An electronic timepiece as claimed in claim 14, wherein said processing circuit means includes write-in processing means coupled to said memory, said write-in processing means being adapted to vary the predetermined coefficient stored in said memory by writing therein a different predetermined coefficient.

* * * * *